United States Patent
Shibamoto

(10) Patent No.: US 8,203,849 B2
(45) Date of Patent: Jun. 19, 2012

(54) SEMICONDUCTOR DEVICE AND MANUFACTURE METHOD THEREOF

(75) Inventor: Masanori Shibamoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 1045 days.

(21) Appl. No.: 11/716,606

(22) Filed: Mar. 12, 2007

(65) Prior Publication Data

US 2007/0215380 A1 Sep. 20, 2007

(30) Foreign Application Priority Data

Mar. 15, 2006 (JP) .................. 2006-071130

(51) Int. Cl.
*H05K 1/11* (2006.01)

(52) U.S. Cl. ........ 361/790; 361/764; 361/767; 174/260; 174/524; 174/525; 257/686; 257/678; 257/702; 257/723; 257/738; 257/758; 257/777

(58) Field of Classification Search .................. 361/790, 361/764, 767; 257/686, 678, 702, 758, 723, 257/738, 777; 174/260, 524, 525
See application file for complete search history.

(56) References Cited

U.S. PATENT DOCUMENTS

| | | | | |
|---|---|---|---|---|
| 4,967,262 A * | 10/1990 | Farnsworth | .................. | 257/678 |
| 5,583,376 A * | 12/1996 | Sickler et al. | .................. | 257/702 |
| 5,759,047 A * | 6/1998 | Brodsky et al. | .................. | 439/66 |
| 6,215,180 B1 * | 4/2001 | Chen et al. | .................. | 257/720 |
| 6,294,407 B1 * | 9/2001 | Jacobs | .................. | 438/118 |
| 6,376,769 B1 * | 4/2002 | Chung | .................. | 174/524 |
| 6,455,936 B1 * | 9/2002 | Lo et al. | .................. | 257/758 |
| 6,706,557 B2 * | 3/2004 | Koopmans | .................. | 438/109 |
| 2003/0170444 A1 * | 9/2003 | Stewart et al. | ............ | 428/317.7 |
| 2003/0170450 A1 * | 9/2003 | Stewart et al. | .................. | 428/343 |
| 2005/0040509 A1 * | 2/2005 | Kikuchi et al. | .................. | 257/686 |
| 2005/0151554 A1 * | 7/2005 | Rae et al. | .................. | 324/760 |
| 2006/0112550 A1 * | 6/2006 | Kim et al. | .................. | 29/884 |
| 2006/0157843 A1 * | 7/2006 | Hwang | .................. | 257/686 |
| 2006/0170090 A1 * | 8/2006 | Shinma et al. | .................. | 257/686 |
| 2006/0220208 A1 * | 10/2006 | Onodera et al. | .................. | 257/686 |
| 2007/0187818 A1 * | 8/2007 | Lyne | .................. | 257/734 |

FOREIGN PATENT DOCUMENTS

| | | |
|---|---|---|
| JP | 8-172144 | 7/1996 |
| JP | 11-8334 | 1/1999 |
| JP | 2001-15627 | 1/2001 |
| JP | 2003-218273 | 7/2003 |
| JP | 2003-273321 | 9/2003 |

* cited by examiner

*Primary Examiner* — Xiaoliang Chen

(74) *Attorney, Agent, or Firm* — McGinn IP Law Group, PLLC

(57) ABSTRACT

A joint board is arranged between an upper package and a lower package. The arrangement of the joint board makes it possible to reduce the size of solder balls and to arrange them with narrower pitch. The joint board has slightly greater dimensions those of the upper package and the lower package. This makes it possible to prevent underfill from leaking and spreading.

16 Claims, 7 Drawing Sheets

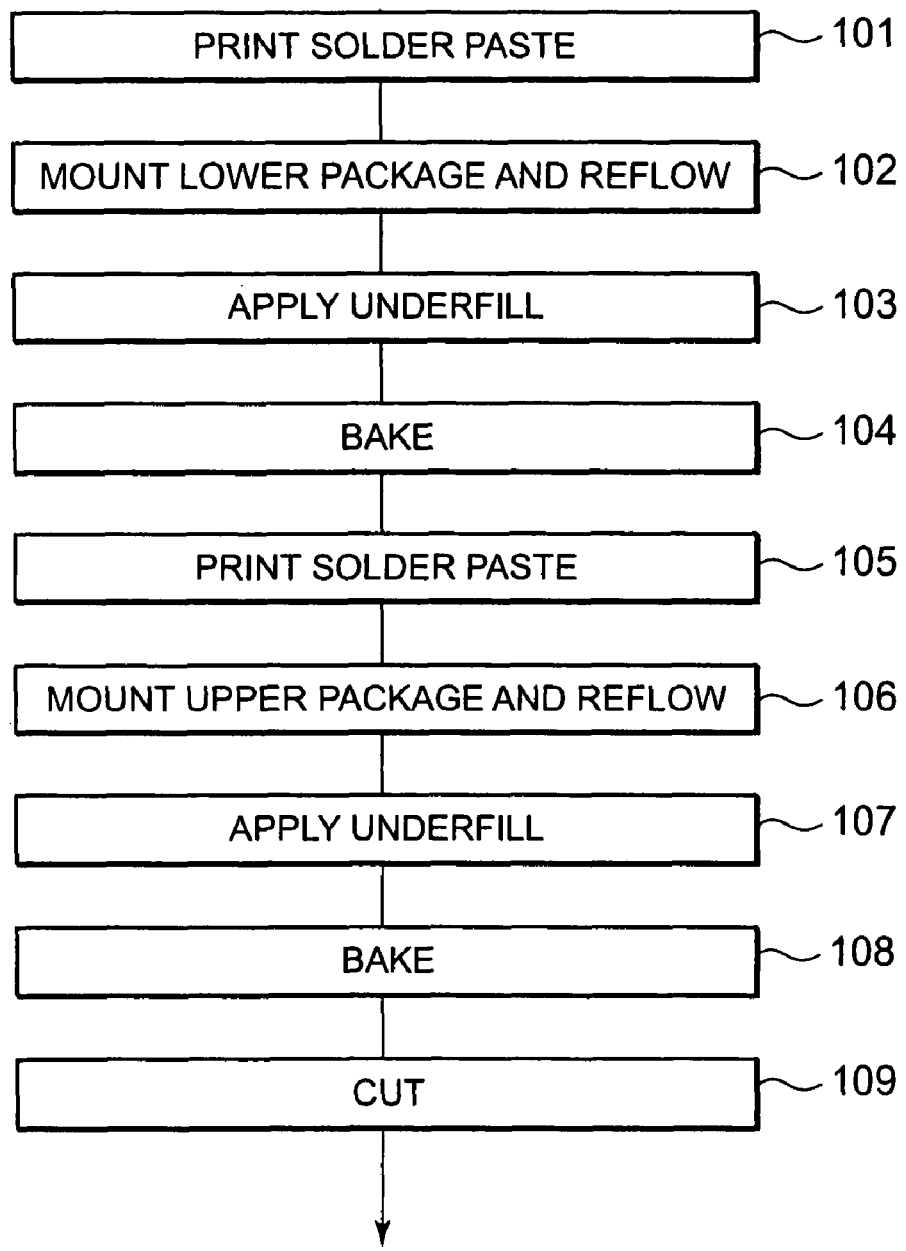

SEMICONDUCTOR DEVICE AND MANUFACTURE METHOD THEREOF

This application claims priority to prior Japanese patent application JP2006-71130, the disclosure of which is incorporated herein by reference.

BACKGROUND OF THE INVENTION

The present invention relates to a semiconductor device, and in particular to a semiconductor device having a PoP (Package on Package) structure in which packages each having a semiconductor element mounted thereon are stacked. The present invention also relates to a manufacture method of such semiconductor device.

In recent years, the package has been reduced in size in order to reduce the size of semiconductor devices following the increase of the operation speed and capacity of the semiconductor devices. Particularly, in case of a portable equipment, use has been made of an MCP (Multi Chip Package) having a plurality of semiconductor elements mounted in the package. However, the MCP has a disadvantage in terms of cost since if one or more semiconductor elements in the MCP are defective, the other non-defective semiconductor elements are also treated as defectives. Preliminary inspection of the semiconductor elements themselves is possible. However, the distance between output terminals thereof is very small. This causes problems such as difficulty to set up a test jig, and possible cracks if silicon is used alone. Therefore, the PoP (Package on Package) technique is expected as an effective measure for solving such problems. According to the PoP technique, semiconductor elements are packaged in package, and the packages which have been inspected are stacked together.

FIG. 1 and FIG. 2 are side views showing a typical PoP structure. According to the PoP technique, a plurality of packages each having a semiconductor element sealed with a resin are stacked and these packages are connected through solder balls. The PoP structure shown in FIGS. 1 and 2 has two packages stacked together. The lower package is composed of a lower circuit board 4 which has solder balls 6 on its rear face, and has a semiconductor element portion 3 having a semiconductor element sealed therein with a resin and a connection land on its front face. The upper package is composed of an upper circuit board 2 which has a connection land on its rear face, and has a semiconductor element portion 1 having a semiconductor element sealed with a resin on its front face. The upper and lower wiring boards 2 and 4 are connected at their connection lands through the solder balls 6. The semiconductor element portion 3 is mounted in a central part of the upper surface of the lower package. In this case, the height of the solder balls 6 must be greater than that of the semiconductor element portion 3 of the lower package in order to prevent the rear face of the wiring board 2 of the upper package from abutting against the semiconductor element portion 3.

On the other hand, the solder balls for connecting the upper and lower packages are required to be smaller in size and to be arranged with narrower pitch in order to cope with the increase of connection terminals due to the enhancement of performance. However, since the sphericity of the solder balls is determined by the physical properties of the solder itself, it is impossible to intentionally form the solder balls into a shape elongated in a height direction. Further, there is a limit to decrease the thickness of the semiconductor element portion 3 of the lower package. Therefore, the increase of the number of the connection terminals inevitably leads to increase of the size of solder balls and increase of the dimensions of the package profile. In order to avoid such problems, Japanese Laid-Open Patent Publication No. H08-172144 (Patent Publication 1) proposes to form the circuit board 4 of the lower package into a concave shape, as shown in FIG. 2, by providing a board 4-1 in the periphery of the circuit board 4 so that the circuit board 4 is surrounded with banks. This package enables reduction of the solder ball size and narrowing of the pitch. However, this is not an optimal solution in view of the workability of the wiring board and the cost.

Cellular phones are one of principal applications of the PoP technique. By the nature of the cellular phones, importance is particularly placed on the reliability of connections when they are subjected to stress due to drop impact or the like. In order to improve the reliability of the connections, use is made of a method of alleviating the stress applied by impact to soldered portions by injecting underfill into the spaces between mounting boards and packages after completing the packaging process. In the case of a conventional MCP, only one connecting portion is placed between a mounting board and an interlayer portion of the MCP. In the case of a PoP, in contrast, two connecting portions are placed between a mounting board and a lower package, and between the lower package and an upper package. The injection of the underfill is carried out by the use of a thin nozzle so as to fill the space between the packages and the mounting board. In the case of a PoP, however, there is a problem that uniform injection cannot be obtained in a position between the lower package and the upper package unless more underfill than necessity is applied. This may cause various adverse effects such as warpage of the circuit board or the underfill spreading over and wetting a large area around the PoP. The underfill may be injected by using a jet nozzle, but this requires introduction of an additional apparatus.

Further, it is desired for the PoP that semiconductor elements to be mounted on the lower and upper packages can be selected and combined without any restriction. Since pad positions differ among the semiconductor elements, the lower and upper packages must be redesigned and produced as separate products. This will induce a problem of complicating the management in the mass production site. In contradiction to the demand for size reduction, the number of output terminals of the semiconductor devices mounted in portable equipment has been increased following the improvement in functions thereof. Therefore, there is a demand for a PoP structure suitable for mass production and yet capable of connection with narrow pitch so as to realize both multiple pins and size reduction.

There are more patent publications relating to a PoP technique as described below. According to Japanese Laid-Open Patent Publication NO. 2003-273321 (Patent Publication 2) and Japanese Laid-Open Patent Publication NO. 2003-218273 (Patent Publication 3), a circuit board having a semiconductor chip mounted is stacked with an interlayer board having an opening for accommodating the semiconductor chip, by means of bumps. Japanese Laid-Open Patent Publication NO. 2001-015627 (Patent Publication 4) discloses a technique in which an opening is formed in a package substrate, and a semiconductor chip is mounted in this opening. According to Japanese Laid-Open Patent Publication NO. 11-008334 (Patent Publication 5), a substrate sealed with a resin is cut off into sections to provide a single BGA (Ball Grid Array) package.

SUMMARY OF THE INVENTION

As described above, in contradiction to the demand for size reduction, the number of output terminals of the semiconductor devices mounted in portable equipment has been increased following the improvement in functions thereof. Therefore, there is a demand for a PoP structure suitable for mass production and yet capable of connection with narrow pitch so as to realize both multiple pins and size reduction.

In view of the problems above, it is an object of the present invention to provide a semiconductor device having a PoP (Package on Package) structure suitable for mass production and yet capable of connection with narrow pitch, and thus realizing both multiple pins and size reduction.

In order to achieve the above-mentioned object, the present invention basically employs the techniques described below. It is to be understood that applied techniques derived by various modifications without departing from the scope of the invention are also included the present invention.

A semiconductor device according to the present invention includes a plurality of stacked packages each having a semiconductor element mounted thereon. A joint board having a greater size than the packages is arranged between an upper package and a lower package.

In the semiconductor device of the present invention, the joint board preferably has an opening that is greater than a semiconductor element portion of the lower package, and the semiconductor element portion of the lower package is arranged in the opening.

In the semiconductor device of the present invention, the semiconductor element portion of the lower package is preferably smaller than a semiconductor element portion of the upper package stacked thereon.

In the semiconductor device of the present invention, the joint board preferably has a wiring pattern which differs depending on the upper and lower packages.

In the semiconductor device of the present invention, the joint board is preferably connected to the upper and lower packages by connection means selected from among solder balls, solder paste, and solder flux.

In the semiconductor device of the present invention, spaces between the joint board and the upper and lower packages are preferably filled with underfill.

In the semiconductor device of the present invention, each side of the joint board is preferably greater than each side of the upper and lower packages by 50 μm or more.

The present invention provides a method of manufacturing a semiconductor device having a plurality of stacked packages each having a semiconductor element mounted thereon. The manufacture method comprises a first connection step of connecting a package having a semiconductor element to one surface of a joint board frame having a plurality of openings; a second connection step of connecting another package to the other surface of the joint board frame; and a step of cutting the joint board frame into separate pieces having a size greater than either of the two packages.

The manufacture method of the semiconductor device according to the present invention further preferably comprises an underfill application step and a baking step after each of the first and second connection steps.

The manufacture method of the semiconductor device according to the present invention preferably further comprises an underfill application step and a baking step after the second connection step.

In the manufacture method of the semiconductor device according to the present invention, the joint board frame is preferably connected to the packages arranged on the upper and lower sides of the joint board frame by connection means selected from among solder balls, solder paste, and solder flux.

In the semiconductor device according to the present invention, a joint board is arranged between the upper and lower packages. The arrangement of the joint board provides advantageous effects that the size of solder balls can be reduced and the solder balls can be arranged with narrower pitch. The joint board is formed to be slightly greater than the upper and lower packages. This has an effect of preventing the underfill from leaking and spreading. According to the present invention, stacked packages having multiple pins arranged with narrow pitch and yet having high reliability and high mass productivity can be provided with low cost.

BRIEF DESCRIPTION OF THE DRAWINGS

FIG. 10 is a flowchart illustrating a manufacturing process according to the present invention.

DESCRIPTION OF THE PREFERRED EMBODIMENTS

Figure 1:
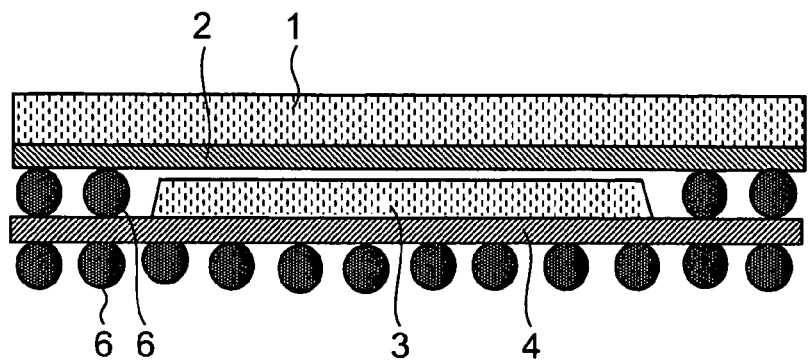
FIG. 1 is a side view of a conventional PoP structure.
Figure 2:
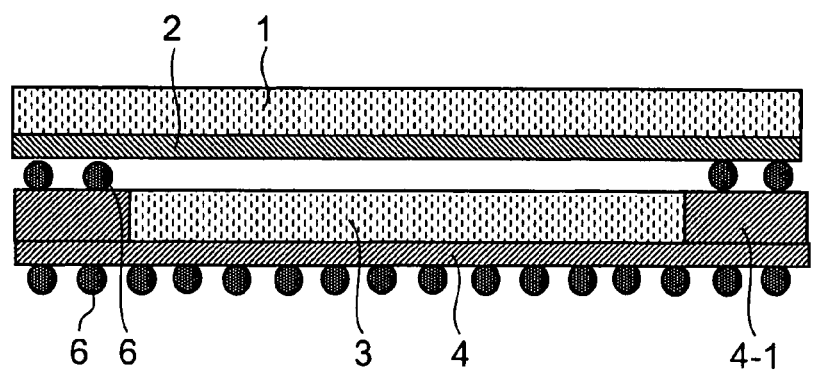
FIG. 2 is a side view of a conventional PoP structure with a concave shape.
Figure 3:
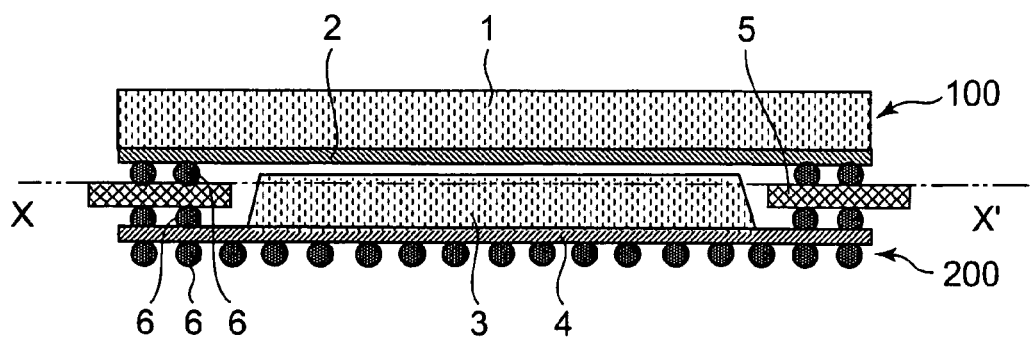
FIG. 3 is a side view of a PoP structure according to the present invention.
Figure 4:
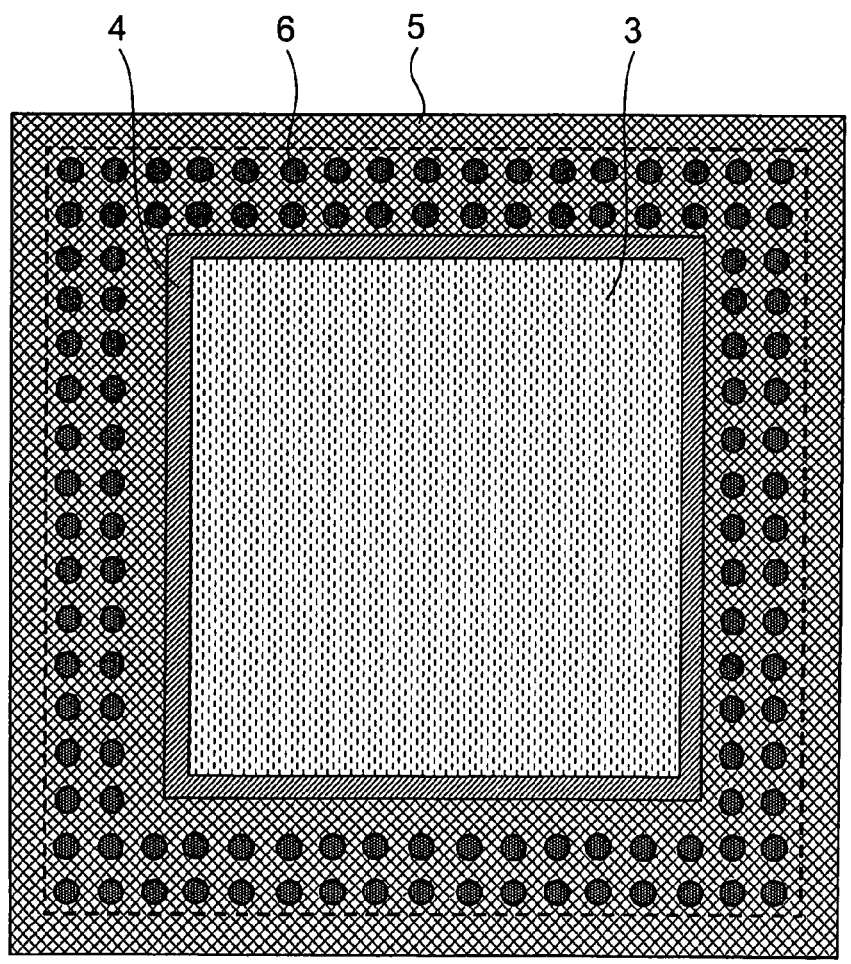
FIG. 4 is a cross-sectional view of the package taken along the line X-X' of FIG. 3.
Figure 5:
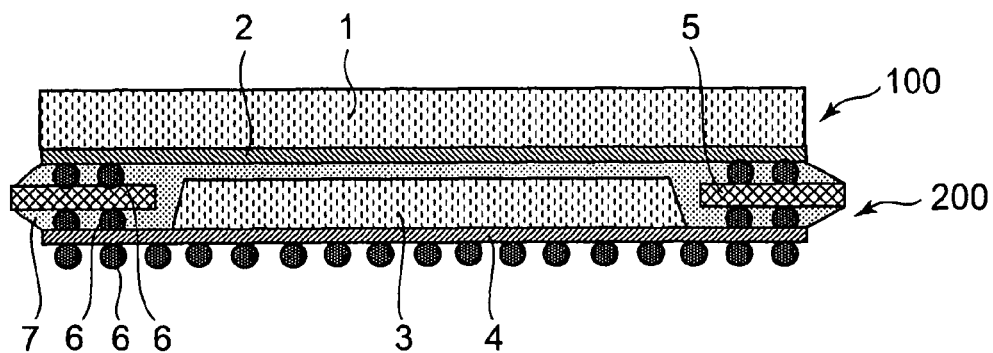
FIG. 5 is a side view of the PoP structure having underfill injected according to the present invention.
Figure 6:
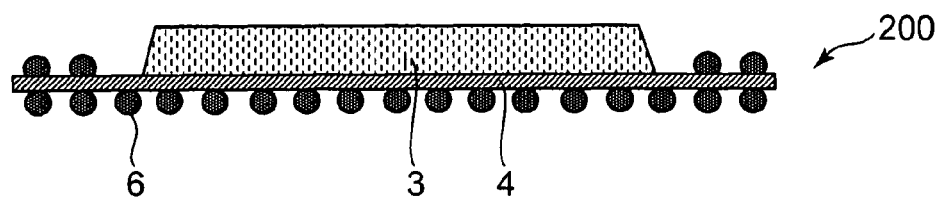
FIG. 6 is a side view of the lower package according to the present invention.
Figure 7:
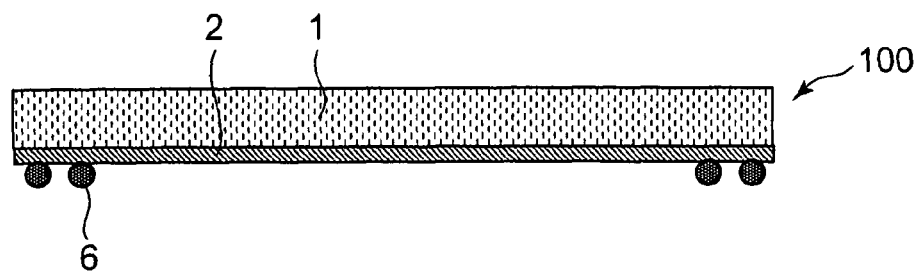
FIG. 7 is a side view of the upper package according to the present invention.
Figure 8:
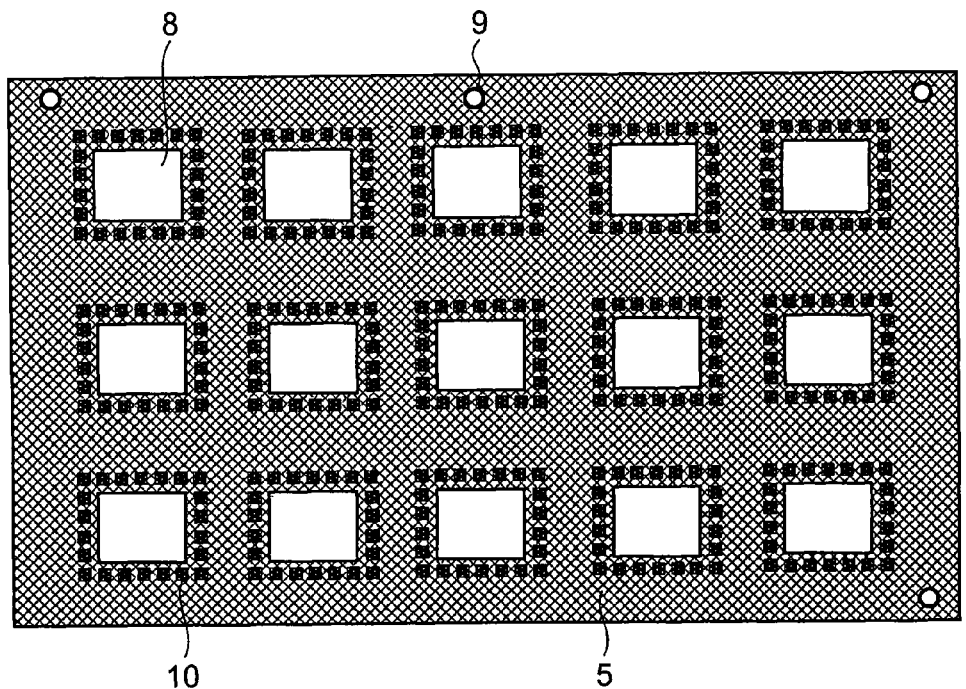
FIG. 8 is a top plan view of a joint board frame according to the present invention.
Figure 9:
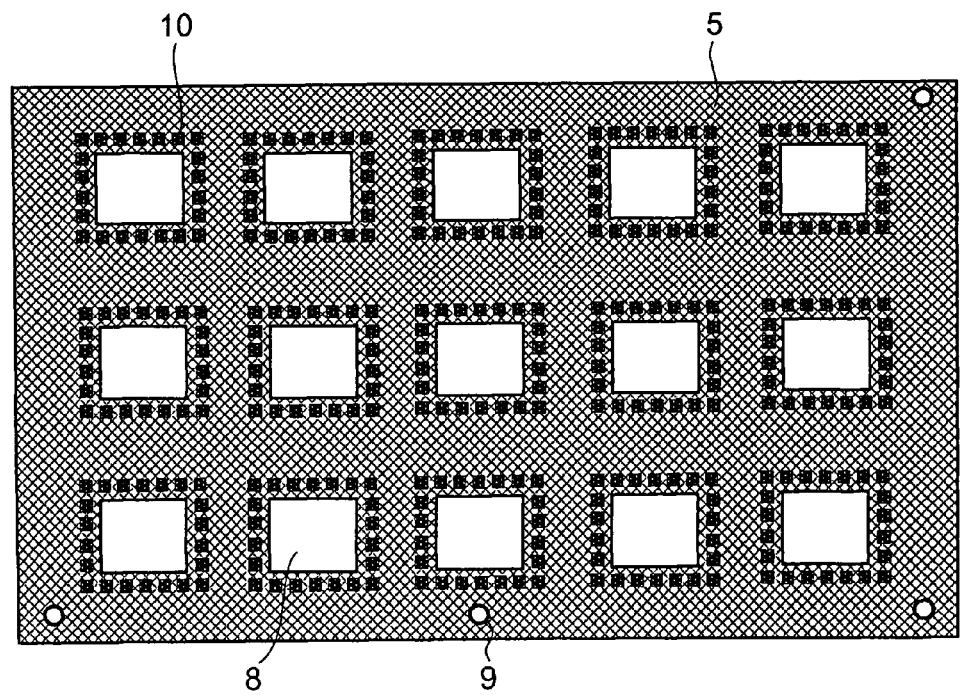
FIG. 9 is a rear plan view of the joint board frame according to the present invention.

Description will be made of a semiconductor device and a manufacture method thereof according to the present invention, with reference to FIGS. 3 to 12. FIG. 3 is a side view of a PoP structure according to the present invention. FIG. 4 is a cross-sectional view taken along the X-X' in FIG. 1, and FIG. 5 is a side view of the PoP structure of FIG. 1 having underfill injected thereinto. FIG. 6 is a side view of a lower package of the PoP structure, and FIG. 7 is a side view of an upper package. FIG. 8 is a top plan view of a joint board frame, and FIG. 9 is a rear plan view of the joint board frame. FIG. 10 is a flowchart illustrating a manufacturing process of the present invention. FIGS. 11A to 11C and FIGS. 12A to 12C are side views showing respective principal steps of the manufacturing process.

The following description of a semiconductor device according to the present invention will be made on the assumption that upper and lower packages are BGA (Ball Grid Array) packages using solder balls. Since the BGA packages have typical well-known internal configuration, description thereof will be omitted. The upper package 100 shown in FIG. 7 has solder balls 6 on its rear side, and a wiring board 2 having a semiconductor element portion 1 mounted thereon is provided on the front side of the upper package. The semiconductor element portion 1 includes at least one or more semiconductor elements, which are connected to the wiring board 2 by means of a gold wire or a flip chip. The semiconductor elements are typically covered with an epoxy resin. However, the sealing with a resin is only one of options available in the present invention, and is not restrictive. The shape of the solder balls provided on the opposite side from the side on which the semiconductor element portion 1 is mounted is not necessarily spherical but may be hemispherical.

A lower package 200 shown in FIG. 6 has solder balls 6 on the rear side, and a wiring board 4 having a semiconductor element portion 3 mounted thereon is provided on the front side. The semiconductor element portion 3 includes at least one or more semiconductor elements, which are connected to the wiring board 4 through a gold wire or a flip chip. The semiconductor elements are typically covered with an epoxy resin. However, the sealing with a resin is only one of options available in the present invention, and is not restrictive. The shape of the solder balls 6 provided on the opposite side (rear side) from the side on which the semiconductor element portion 3 is mounted is not necessarily spherical but may be hemispherical.

Solder balls 6 are further provided along the periphery of the same face (front face) on which the semiconductor element portion 3 of the lower package 200 is mounted, for the purpose of connection with the upper package 100 via a joint board frame 5. The shape of these solder balls 6 is not necessarily spherical, but may be hemispherical. The solder balls 6 may even be omitted from the side on which the semiconductor element portion 3 is mounted. This is because typical semiconductor packages known as LGA (Land Grid Array) packages can be connected only at terminals by using solder paste in a packaging process. In this case, lands (not shown) are provided as wiring board terminals in the positions on the wiring boards 2 and 4 where the solder balls 6 are provided. Solder balls 6 are provided along the periphery of the lower package 200 for the purpose of connection with the upper package 100 via the joint board frame 5. Therefore, the size of the semiconductor element portion 3 of the lower package 200 is smaller than that of the semiconductor element portion 1 of the upper package 100.

Description will be made of the joint board frame 5 used for stacking the packages 100 and 200, with reference to FIGS. 8 and 9. The joint board frame 5 is made of a frame shape having a plurality of joint board openings 8. Individual joint boards are provided by cutting the joint board frame 5. The joint board frame 5 enables batch processing during the manufacturing process and thus is suitable for mass production. FIG. 8 shows the front face of the joint board frame 5, while FIG. 9 shows the rear face of the joint board frame 5. The joint board frame 5 includes a plurality of joint board openings 8, joint board terminals (lands) 10 provided around the openings for the purpose of connection, and joint board positioning holes 9. The joint board openings 8 are formed slightly greater than the semiconductor element portions 3 so that the semiconductor element portions 3 of the lower packages 200 can be arranged therein. The terminals (lands) are provided on the front and rear sides around each of the joint board openings 8, at the same positions as those of the terminals of upper and lower packages 100 and 200, so that they can be soldered to the upper and lower packages 100 and 200.

The joint board positioning holes 9 are provided for positioning the joint board frame 5 upon connecting the upper and lower packages 100 and 200.

Figure 11A:
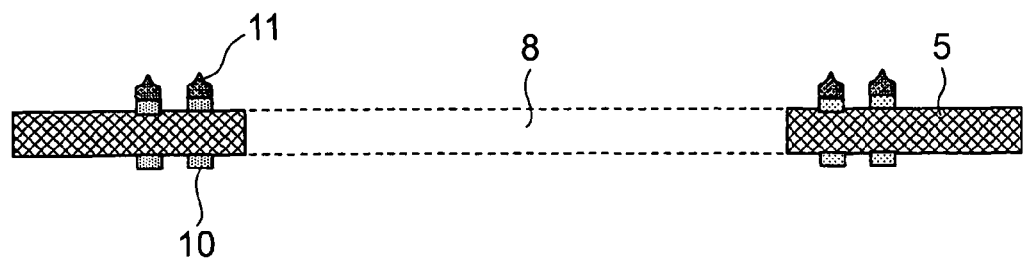
FIG. 11A is a side view illustrating one of principal manufacturing steps according to the present invention.
Figure 11B:
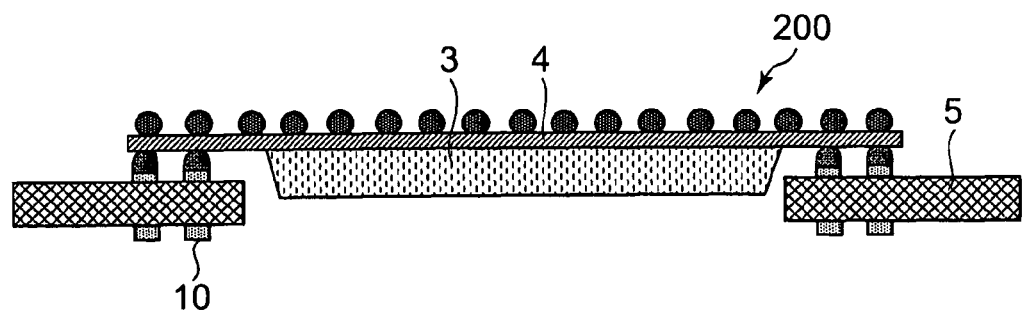
FIG. 11B is a side view illustrating one of the principal manufacturing steps according to the present invention.
Figure 11C:
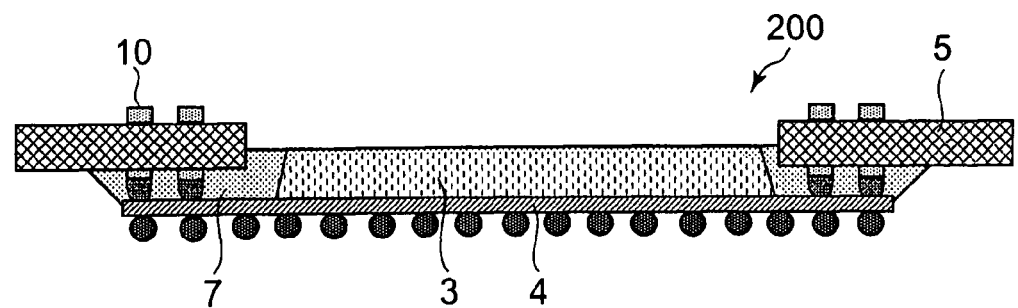
FIG. 11C is a side view illustrating one of the principal manufacturing steps according to the present invention.

Subsequently, description will be made of a package stacking process with reference to FIGS. 11, 12, and 13. At first, solder paste 11 is printed on the terminals (lands) 10 of the joint board frame 5 (FIG. 11A). The lower packages 200 are mounted and fixedly connected by reflowing the solder paste (FIG. 11B). Although flux may be used for the connection, solder paste is more desirable in consideration of warpage of the packages. After conducting a cleaning process, underfill 7 is applied through the joint board openings 8 and baked (FIG. 11C). The underfill need not necessarily be applied through the openings 8 of the joint board frame 5, but may be applied from the peripheries of the packages. In this case, the joint board frame 5 prevents the underfill from leaking and spreading.

Figure 12A:
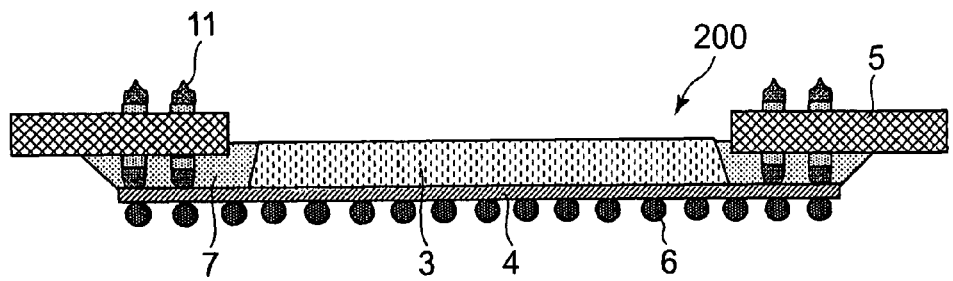
FIG. 12A is a side view illustrating one of the principal manufacturing steps according to the present invention.
Figure 12B:
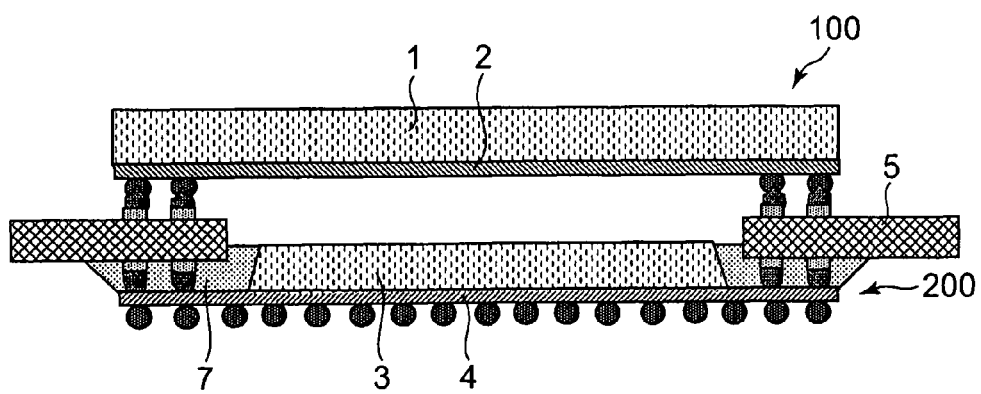
FIG. 12B is a side view illustrating one of the principal manufacturing steps according to the present invention.

Subsequently, the solder paste 11 is printed on the terminals 10 (lands) on the opposite side of the joint board frame 5 (FIG. 12A). Then, the upper packages 100 are mounted, and fixedly connected by reflowing the solder paste (FIG. 12B). Although flux may be used for the connection of the upper packages as well, solder paste 11 is more desirable in consideration of warpage of the packages 100 and 200. After conducting a cleaning process, the underfill 7 is injected from the peripheries of the packages 100 and 200.

Figure 12C:
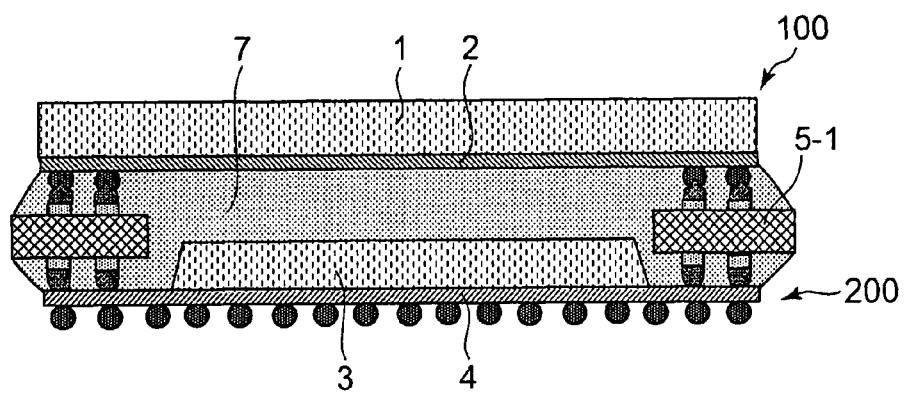
FIG. 12C is a side view illustrating one of the principal manufacturing steps according to the present invention.

Finally, the joint board frame 5 is divided into separate pieces by a dicing process to provide individual joint boards 5-1 (FIG. 12C). It is important, in dicing the joint board frame 5, to cut out each piece slightly larger than the packages mounted on the top and rear faces, in consideration of possible misalignment between the mounted packages, disparity in design between the front and rear faces of the joint board frame 5, and a shape of underfill fillet. The size of each of the joint boards 5-1 may be greater than that of the upper and lower packages 100 and 200 by 50 µm or more in order to prevent damage to the packages during the cutting process. Therefore, there is no substantial effect in terms of size. As a result, a PoP structure with high reliability can be manufactured without giving damage to the upper and lower packages 100 and 200 during the cutting process.

FIG. 10 shows the flow of the manufacturing process described above.

In the first step, solder paste 11 is printed on one surface of a joint board frame 5 (step 101). Lower packages 200 are mounted and fixedly connected by reflowing the solder paste 11 (step 102). Underfill is applied and baked to protect and strengthen the connections with the lower packages 200 (steps 103 and 104).

Then, Solder paste 11 is printed on the other surface of the joint board frame 5 (step 105). Upper packages 100 are mounted and fixed connected by reflowing the solder paste 11 (step 106). Further, underfill is applied and baked to protect and strengthen the connections with the lower packages 200 (steps 107 and 108). Finally, the joint board frame 5 is cut off to obtain the joint board 5-1 (step 109).

FIGS. 3 and 5 are side views of a PoP structure thus produced.

FIG. 3 shows a PoP structure having no underfill applied, while FIG. 5 shows a PoP structure having the underfill applied. FIG. 4 is a cross-sectional view taken along the line X-X' of FIG. 3.

As shown in FIG. 3, the lower package 200 has the semiconductor element portion 3 mounted on the wiring board 4. The upper package 100 has the semiconductor element portion 1 mounted on the wiring board 2 and is stacked over the lower package 200. The joint board frame 5 is arranged between the upper package 100 and the lower package 200 and has a greater size than each of the lower and the upper packages 100 and 200.

As described above, the lower package 200 and the upper package 100 are connected to each other with the joint board frame 6 interposed therebetween. The arrangement of the joint board frame 6 makes it possible to select the size of the solder balls 6 as desired since the adjustment with the height of the semiconductor element portion 3 of the lower package 200 can be performed by means of the joint board frame 6. This makes it possible to reduce the size of the solder balls 6 and to arrange them with narrow pitch. Further, when consideration is given to a case in which the combination of the upper and lower packages 100 and 200 is to be changed, for example, a new PoP structure can be easily obtained by redesigning a joint board frame 5 according to the terminal arrangement of the lower package 200 and the terminal arrangement of the upper package 100 in the new combination. This means that a PoP can be manufactured, which allows any desired combination between upper and lower packages 100 and 200 of a standard type, only by changing the design of the joint board frame 5.

The embodiment above uses a frame-shaped joint board frame 5 having a plurality of joint boards linked together and cuts the joint board frame 5 in the final step of the process. However, it is also possible to form individual joint boards in the first step and connect them to the lower and upper packages 100 and 200. In this case, each of the individual joint boards is fixedly connected to a lower package 200 in the first place, and then an upper package 100 is connected to the joint board. In this case as well, the size of the joint board is rendered slightly greater than the upper and lower packages 100 and 200.

Although, in the embodiment above, the lower package 200 is mounted before the upper package 100, the upper package 100 may be mounted before the lower package 200. Further, the method of connecting the wiring boards 2, 4 and the joint board frame 5 is not particularly limited. They may be connected by using solder balls, solder paste, or flux, or by transferring flux to solder balls and reflowing them. Further, in the embodiment above, the underfill is injected twice, each time after connecting the upper and lower packages 100 and 200. However, the underfill may be injected collectively only once after the connection of the upper and lower packages 100 and 200. Although the injection of the underfill protects and enhances the connections, the injection of the underfill is not necessary if the connections are strong enough.

The semiconductor device according to the present invention has the joint board frame 5 arranged between the upper package 100 and the lower package 200. The arrangement of the joint board frame 5 makes it possible to reduce the size of the solder balls 6 and to arrange them with narrower pitch. The size of the joint board frame 6 is rendered slightly greater than that of the upper and lower packages 100 and 200. The slightly greater joint board frame 5 prevents the underfill from leaking and spreading. Consequently, the present invention is able to provide stacked packages having multiple pins arranged with narrow pitch and yet having high reliability and high mass productivity, with low cost.

The present invention has been described specifically on the basis of the preferred embodiments, but the present invention is not limited to the embodiments above. It is to be understood that various changes and modifications may be made within the scope of the invention, and all these changes and modifications fall within the spirit and scope of the present invention.

What is claimed is:

1. A semiconductor device, comprising:
    a first package comprising a first semiconductor element;
    a second package for stacking over the first package, the second package comprising a second semiconductor element; and
    a joint board arranged between the first package and the second package, the joint board comprising:
        an outer periphery having a size that is greater than a size of an outer periphery of the first package and a size of an outer periphery of the second package; and
        an opening having a size that is greater than a size of a surface area of the first semiconductor element,
    wherein a space between the joint board and the first and second packages is filled with an underfill material, said underfill material extending from the outer peripheries of the first and second packages to the outer periphery of the joint board.

2. The semiconductor device according to claim 1, wherein the first semiconductor element arranges in the opening.

3. The semiconductor device according to claim 1, wherein the first semiconductor element is smaller than the second semiconductor element.

4. The semiconductor device according to claim 1, wherein the joint board is connected to the first package and the second package by one of solder balls, solder paste, and solder flux.

5. The semiconductor device according to claim 1, wherein each side of the joint board is greater than each side of the first and second packages by 50 μm or more.

6. The semiconductor device according to claim 1, wherein the joint board comprises:
    a first main surface comprising a plurality of first electrodes connected to a plurality of electrodes of the first package; and
    a second main surface opposing to the first main surface having a plurality of second electrodes connected to a plurality of electrodes of the second package.

7. The semiconductor device according to claim 1, wherein the joint board comprises a wiring pattern having a design based on the first package and the second package.

8. The semiconductor device according to claim 1, wherein the size of the first package and the size of the second package is the same.

9. The semiconductor device according to claim 1, wherein the first package comprises a wiring board,
    wherein the first semiconductor element is mounted on a surface of the wiring board, and
    wherein a plurality of first electrodes are formed on the surface of the wiring board.

10. The semiconductor device according to claim 1, wherein said opening comprises an application of said underfill material.

11. The semiconductor device according to claim 1, wherein said underfill material extends from the outer peripheries of the first and second packages in an outward direction to the outer periphery of the joint board.

12. A joint board for connecting electronic devices, comprising:
    a plurality of first joint board terminals formed on a first surface of the joint board to connect a first package and the joint board;
    a plurality of second joint board terminals formed on a second surface of the joint board opposing to the first surface to connect a second package and the joint board; and
    an opening formed in a center portion of the joint board, said opening having a size that is greater than a size of a surface area of a first semiconductor element of the first package, wherein the joint board comprises an outer periphery having a size that is greater than a size of an outer periphery of the first package and a size of an outer periphery of the second package, and wherein a space between the joint board and the first and second packages is filled with an underfill material, said underfill material extending from the outer peripheries of the first and second packages to the outer periphery of the joint board.

13. The joint board according to claim 12, wherein the plurality of first terminals and the plurality of second terminals comprise one of solder balls, solder paste, and solder flux.

14. The joint board according to claim 12, further comprising:
    a wiring pattern having a design based on the first and second packages.

15. The joint board according to claim 12, wherein said opening comprises an application of said underfill material.

16. The joint board according to claim 12, wherein said underfill material extends from the outer peripheries of the first and second packages in an outward direction to the outer periphery of the joint board.

* * * * *